US009269693B2

(12) United States Patent
Chan et al.

(10) Patent No.: US 9,269,693 B2
(45) Date of Patent: Feb. 23, 2016

(54) FABRICATION METHOD OF SEMICONDUCTOR PACKAGE

(71) Applicant: Siliconware Precision Industries Co., Ltd., Taichung (TW)

(72) Inventors: Chien-Feng Chan, Taichung (TW); Chun-Tang Lin, Taichung (TW); Yi-Che Lai, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/604,128

(22) Filed: Jan. 23, 2015

(65) Prior Publication Data
US 2015/0132893 A1 May 14, 2015

Related U.S. Application Data

(62) Division of application No. 13/753,930, filed on Jan. 30, 2013, now Pat. No. 8,952,528.

(30) Foreign Application Priority Data

Nov. 20, 2012 (TW) ............................. 101143204 A (51) Int. Cl.
*H01L 33/06* (2010.01)
*H01L 23/00* (2006.01)
(Continued)

(52) U.S. Cl.
CPC .............. *H01L 24/94* (2013.01); *H01L 21/561* (2013.01); *H01L 21/78* (2013.01); *H01L 23/49816* (2013.01); *H01L 24/11* (2013.01); *H01L 24/97* (2013.01); *H01L 25/0657* (2013.01); *H01L 25/50* (2013.01); *H01L 28/00* (2013.01); *H01L 23/3128* (2013.01); *H01L 24/13* (2013.01); *H01L 24/14* (2013.01); *H01L 24/16* (2013.01);
(Continued)

(58) Field of Classification Search
CPC ....... H01L 21/56; H01L 21/78; H01L 21/561; H01L 23/49816
USPC .................................................. 438/656, 676
See application file for complete search history.

(56) References Cited

U.S. PATENT DOCUMENTS 8,685,761 B2    4/2014  Reed et al.
8,952,528 B2 *  2/2015  Chan ..................... H01L 21/561
                                                    257/678

(Continued)

*Primary Examiner* — Michael Lebentritt
(74) *Attorney, Agent, or Firm* — Mintz Levin Cohn Ferris Glovsky and Popeo, P.C.; Peter F. Corless; Steven M. Jensen (57) ABSTRACT

A semiconductor package is provided. The semiconductor package includes a semiconductor chip having opposite first and second surfaces; an RDL structure formed on the first surface of the semiconductor chip and having opposite third and fourth surfaces and a plurality of first conductive through holes penetrating the third and fourth surfaces thereof, wherein the RDL structure is formed on the semiconductor chip through the fourth surface thereof and electrically connected to the semiconductor chip through a plurality of first conductive elements, and the third surface of the RDL structure has a redistribution layer formed thereon; a plurality of conductive bumps formed on the redistribution layer; and an encapsulant formed on the first surface of the semiconductor chip for encapsulating the RDL structure, wherein the conductive bumps are embedded in and exposed from the encapsulant. The invention effectively prevents warpage of the semiconductor package and improves the electrical connection significantly.

9 Claims, 6 Drawing Sheets (51) Int. Cl.
*H01L 23/498* (2006.01)
*H01L 49/02* (2006.01)
*H01L 21/56* (2006.01)
*H01L 25/065* (2006.01)
*H01L 25/00* (2006.01)
*H01L 21/78* (2006.01)
*H01L 23/31* (2006.01)

(52) U.S. Cl.
CPC ........... *H01L24/32* (2013.01); *H01L 24/73* (2013.01); *H01L 24/92* (2013.01); *H01L 2224/0231* (2013.01); *H01L 2224/12105* (2013.01); *H01L 2224/13025* (2013.01); *H01L 2224/14181* (2013.01); *H01L 2224/16145* (2013.01); *H01L 2224/16225* (2013.01); *H01L 2224/32145* (2013.01); *H01L 2224/32225* (2013.01); *H01L 2224/73204* (2013.01); *H01L 2224/92225* (2013.01); *H01L 2224/94* (2013.01); *H01L 2224/97* (2013.01); *H01L 2225/06513* (2013.01); *H01L 2225/06517* (2013.01); *H01L 2225/06541* (2013.01); *H01L 2225/06548* (2013.01); *H01L 2924/05432* (2013.01); *H01L 2924/05442* (2013.01); *H01L 2924/10253* (2013.01); *H01L 2924/10272* (2013.01); *H01L 2924/10329* (2013.01); *H01L 2924/12042* (2013.01); *H01L 2924/141* (2013.01); *H01L 2924/1421* (2013.01); *H01L 2924/1431* (2013.01); *H01L 2924/1434* (2013.01); *H01L 2924/157* (2013.01); *H01L 2924/15311* (2013.01); *H01L 2924/15787* (2013.01); *H01L 2924/15788* (2013.01); *H01L 2924/18161* (2013.01); *H01L 2924/19103* (2013.01); *H01L 2924/3511* (2013.01)

(56) References Cited

U.S. PATENT DOCUMENTS

| | | |
|---|---|---|
| 2006/0046350 A1 | 3/2006 | Jiang et al. |
| 2007/0075410 A1 | 4/2007 | Chan et al. |
| 2010/0136747 A1 | 6/2010 | Park |
| 2011/0241215 A1 | 10/2011 | Sankman et al. |
| 2013/0043582 A1 | 2/2013 | Haba et al. |
| 2013/0203190 A1 | 8/2013 | Reed et al. |
| 2013/0203240 A1 | 8/2013 | Reed et al. |
| 2014/0084484 A1 | 3/2014 | Chan et al. |

* cited by examiner

FABRICATION METHOD OF SEMICONDUCTOR PACKAGE

CROSS-REFERENCE TO RELATED APPLICATIONS

This application is a divisional of copending application U.S. Serial No. 13/753,930, filed on Jan. 30, 2013, which claims under 35 U.S.C. §119(a) the benefit of Taiwanese Application No. 101143204, filed Nov. 20, 2012, the entire contents of which are incorporated herein by reference.

BACKGROUND OF THE INVENTION

1. Field of the Invention

The present invention relates to semiconductor packages and fabrication methods thereof, and more particularly, to a semiconductor package with a stacked structure and a fabrication method thereof.

2. Description of Related Art

Currently, electronic products are developed towards miniaturization, high electrical performance, multi-functionality and high speed. Accordingly, semiconductor packages are required to have such features as, small size, high electrical performance, multi-functionality, and high speed, to meet the requirement of electronic products.

Flip-chip technologies facilitate the reduction of chip packaging sizes and signal transmission paths and therefore have been widely used for chip packaging. Various types of packages such as chip scale packages (CSPs), direct chip attached (DCA) packages and multi-chip module (MCM) packages can be achieved through flip-chip technologies.

Further, chip stacking technologies have been developed to reduce the size of semiconductor packages and improve the functionality of semiconductor packages. However, warpage caused by thermal stresses can easily happen to such a semiconductor package. On the other hand, when such a semiconductor package is bonded to a packaging substrate through a plurality of conductive bumps, there are thermal stresses on the conductive bumps or lead so as to result in poor electrical joints between the semiconductor package and the packaging substrate.

Figure 1A:
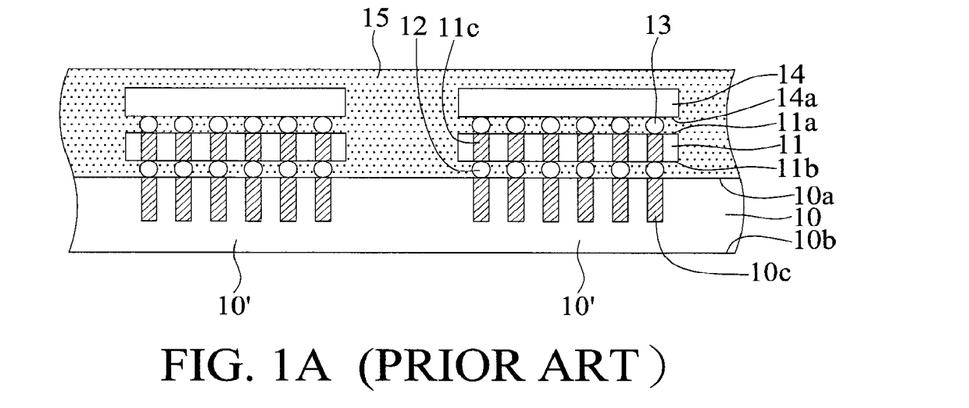
FIGS. 1A to 1C are schematic cross-sectional views illustrating a semiconductor package and a fabrication method thereof according to the prior art.
Figure 1B:
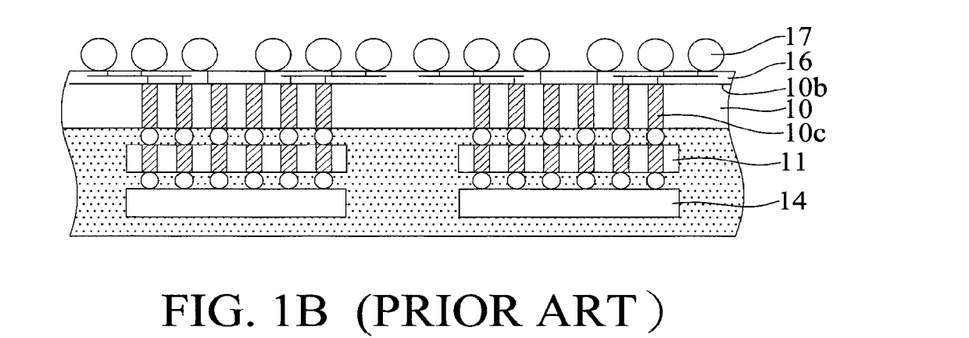
Figure 1C:
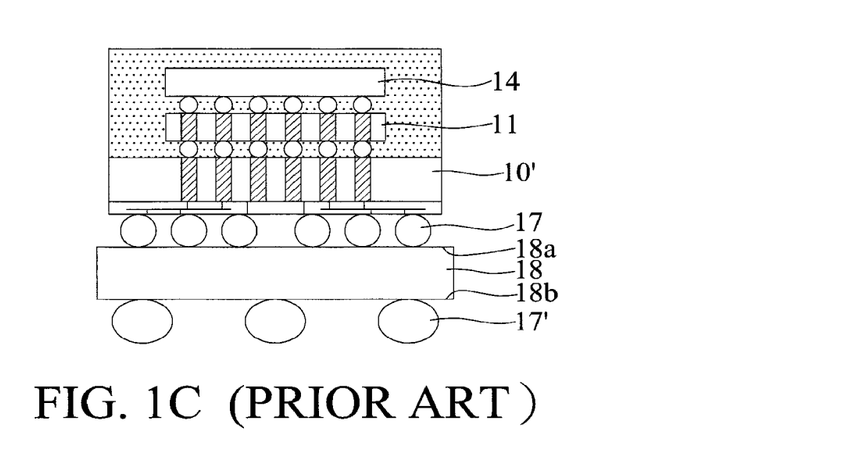

FIGS. 1A to 1C are schematic cross-sectional views illustrating a semiconductor package and a fabrication method thereof according to the prior art.

Referring to FIG. 1A, a semiconductor wafer 10 having a first surface 10a and a second surface 10b opposite to the first surface 10a is provided. The semiconductor wafer 10 has a plurality of semiconductor chips 10' and each of the semiconductor chips 10' has a plurality of conductive posts 10c formed therein. A plurality of connection units 11 are formed on the first surface 10a of the semiconductor wafer 10 corresponding to the semiconductor chips 10'. Each of the connection units 11 has a first surface 11a, a second surface 11b opposite the first surface 11a, and a plurality of first conductive through holes 11c penetrating the first surface 11a and the second surface 11b and electrically connected to the conductive posts 10c of the corresponding semiconductor chip 10' through a plurality of first conductive elements 12.

Further, a plurality of semiconductor chips 14 are formed on the first surfaces 11a of the connection units 11 through bottom surfaces 14a thereof and electrically connected to the connection units 11 through a plurality of second conductive elements 13. Furthermore, an encapsulant 15 is formed on the first surface 10a of the semiconductor wafer 10 for encapsulating the connection units 11, the semiconductor chips 14, the first conductive elements 12 and the second conductive elements 13.

Referring to FIG. 1B, continued from FIG. 1A, the second surface 10b of the semiconductor wafer 10 is ground to expose one ends of the conductive posts 10c and a redistribution layer 16 is formed on the second surface 10b of the semiconductor wafer 10. As such, the semiconductor wafer 10 and the redistribution layer 16 form an RDL (redistribution layer) structure. Further, a plurality of conductive bumps 17 are formed on the redistribution layer 16.

Referring to FIG. 1C, continued from FIG. 1B, a singulation process is performed to form a plurality of semiconductor packages. Further, such a semiconductor package is disposed on a top surface 18a of a substrate 18 through the conductive bumps 17, and a plurality of solder balls 17' are formed on a bottom surface 18b of the substrate 18.

In the above-described method, thermal stresses easily occur in a high temperature process so as to cause warpage of the RDL structure and the connection units. As such, portions of the first conductive elements fail to electrically connect the connection units and the RDL structure and portions of the second conductive elements fail to electrically connect the semiconductor chips and the connection units, thus resulting in an electrical connection failure among the semiconductor chips, the connection units and the semiconductor wafer.

Therefore, there is a need to provide a semiconductor package and a fabrication method thereof to overcome the above-described disadvantages.

SUMMARY OF THE INVENTION

The present invention provides a semiconductor package, which includes: a semiconductor chip having a first surface and a second surface opposite to the first surface; an RDL (redistribution layer) structure formed on the first surface of the semiconductor chip and having opposite third and fourth surfaces and a plurality of first conductive through holes penetrating the third and fourth surfaces thereof, wherein the RDL structure is formed on the semiconductor chip through the fourth surface thereof and electrically connected to the semiconductor chip through a plurality of first conductive elements, and the third surface of the RDL structure has a redistribution layer formed thereon; a plurality of conductive bumps formed on the redistribution layer; and an encapsulant formed on the first surface of the semiconductor chip for encapsulating the RDL structure, wherein the conductive bumps are embedded in and exposed from the encapsulant.

The present invention further provides a fabrication method of a semiconductor package. The fabrication method includes the steps of: providing a semiconductor wafer having a plurality of semiconductor chips respectively with a first surface and a second surface opposite the first surface; forming an RDL (redistribution layer) structure on the first surface of the semiconductor chip and forming an encapsulant on the first surface of the semiconductor chip for encapsulating the RDL structure, wherein the RDL structure has opposite third and fourth surfaces and a plurality of first conductive through holes penetrating the third and fourth surfaces thereof, the RDL structure is formed on the semiconductor chip through the fourth surface thereof and electrically connected to the semiconductor chip through a plurality of first conductive elements, and the RDL structure further has a redistribution layer formed on the third surface thereof and a plurality of conductive bumps formed on the redistribution layer. The conductive bumps are embedded in and exposed from the encapsulant.

In an embodiment, the step of forming the conductive bumps includes the steps of forming the plurality of conductive bumps on the redistribution layer; and forming the encapsulant on the first surface of the semiconductor chip for encapsulating the RDL structures and exposing the conductive bumps.

In another embodiment, the step of forming the conductive bumps includes the steps of forming the plurality of conductive bumps on the redistribution layer; forming the encapsulant on the first surface of the semiconductor chip for encapsulating the RDL structures and the conductive bumps; and removing portions of the encapsulant and the conductive bumps by grinding such that the conductive bumps are flush with a surface of the encapsulant.

In a further embodiment, the step of forming the conductive bumps includes the steps of forming the encapsulant on the first surface of the semiconductor chip for encapsulating the RDL structure; forming a plurality of openings in the encapsulant for exposing portions of the redistribution layer; and forming the plurality of conductive bumps in the openings of the encapsulant, respectively.

In the above-described package and method, one or more connection units can be stacked and formed between the fourth surface of the RDL structure and the first surface of the semiconductor chip in a manner that the one or more connection units are electrically connected to the RDL structure through the first conductive elements and electrically connected to the semiconductor chip through a plurality of second conductive elements, wherein each connection unit has a plurality of second conductive through holes penetrating therethrough and encapsulated by the encapsulant.

The above-described method can further include the step of performing a singulation process. After performing the singulation process, the redistribution layer is formed on a package substrate through the conductive bumps and an underfill is filled between the redistribution layer and the package substrate.

According to the present invention, the RDL structure having a redistribution layer formed thereon is formed on a semiconductor chip, and then an encapsulant is formed on the semiconductor chip to encapsulate the RDL structure and the redistribution layer. Since the second surface of the semiconductor chip is exposed from the encapsulant, heat generated in the semiconductor package during a high temperature process can be effectively dissipated out, thereby preventing warpage and poor electrical connection in the semiconductor package. Further, the present invention facilitates to simplify the fabrication process, reduce the fabrication cost and improve the product yield.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "top", "bottom", "upper", "first", "second", "a" etc. are merely for illustrative purpose and should not be construed to limit the scope of the present invention.

First Embodiment

FIGS. 2A to 2E are schematic cross-sectional views illustrating a semiconductor package and a fabrication method thereof according to the first embodiment of the present invention.

Figure 2A:
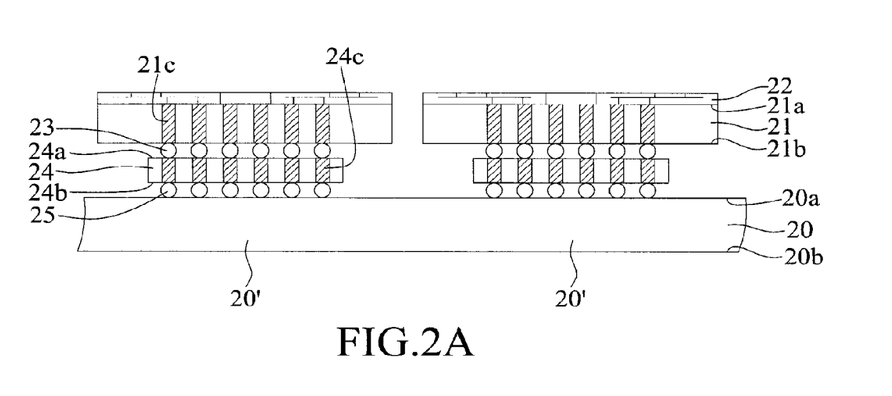
FIGS. 2A to 2E are schematic cross-sectional views illustrating a semiconductor package and a fabrication method thereof according to the first embodiment of the present invention.

Referring to FIG. 2A, a semiconductor wafer 20 has a plurality of semiconductor chips 20'. Each semiconductor chip 20' has a first surface 20a and a second surface 20b opposite to the first surface 20a. An RDL structure 21 is formed on the first surface 20a of the semiconductor chip 20'. The RDL structure 21 has a third surface 21a, a fourth surface 21b opposite to the third surface 21a and a plurality of first conductive through holes 21c penetrating the third surface 21a and the fourth surface 21b. The RDL structure 21 further has a redistribution layer 22 formed on the third surface 21a, and the RDL structure 21 is formed on the first surface 20a of the semiconductor wafer 20 through the fourth surface 21b.

In the present embodiment, a connection unit 24 is further formed between the fourth surface 21b of the RDL structure 21 and the first surface 20a of the semiconductor wafer 20. The connection unit 24 has a fifth surface 24a, a sixth surface 24b opposite to the fifth surface 24a, and a plurality of second conductive through holes 24c penetrating the fifth surface 24a and the sixth surface 24b. The connection unit 24 can have a passive component chip or an active component chip such as a memory chip, an RF chip, a logic chip or an analog chip. A plurality of first conductive elements 23 are formed between the fourth surface 21b of the RDL structure 21 and the fifth surface 24a of the connection unit 24 and corresponding in position to the first conductive through holes 21c and the second conductive through holes 24c for electrically connecting the RDL structure 21 and the connection unit 24. Further, a plurality of second conductive elements 25 are formed between the sixth surface 24b of the connection unit 24 and the first surface 20a of the semiconductor chip 20' and corresponding in position to the second conductive through holes 24c for electrically connecting the connection unit 24 and the semiconductor chip 20'. The first conductive elements 23 and the second conductive elements 25 can be conductive posts, conductive balls or conductive bumps. The RDL structure 21 can have a size greater than or equal to that of the corresponding connection unit 24. The RDL structure 21 and the connection unit 24 can be made of Si, SiC, GaAs, $SiO_2$ such as crystal or glass, or $Al_2O_3$ such as sapphire.

Figure 2B:
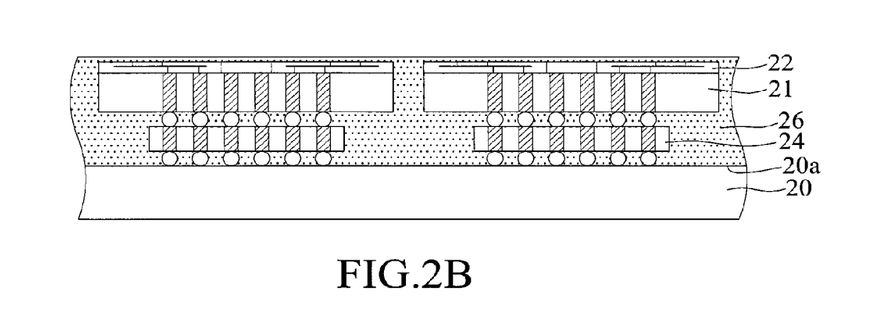

Referring to FIG. 2B, continued from FIG. 2A, an encapsulant 26 is formed on the first surface 20a of the semiconductor chip 20' for encapsulating the connection units 24, the RDL structures 21 and the redistribution layer 22.

Figure 2C:
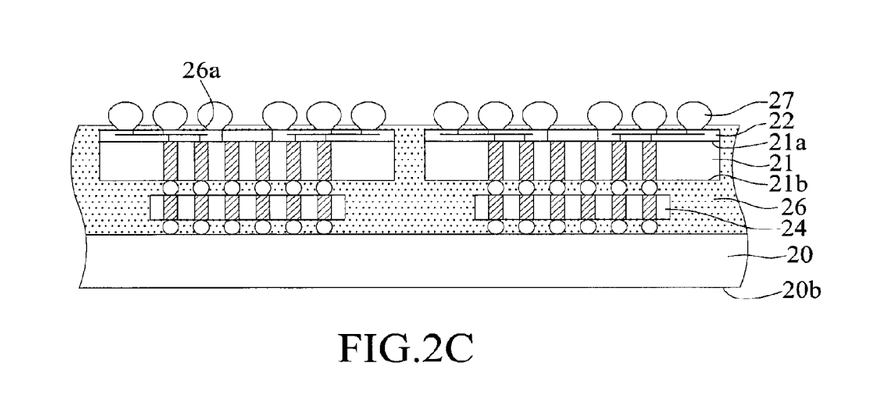

Referring to FIG. 2C, continued from FIG. 2B, a plurality of openings 26a are formed in the encapsulant 26 by laser ablation or etching so as to expose portions of the redistribution layer 22, and a plurality of conductive bumps 27 are formed on the portions of the redistribution layer 22 exposed through the openings 26a of the encapsulant 26. The conductive bumps 27 are embedded in and exposed from the encapsulant 26.

Figure 2D:
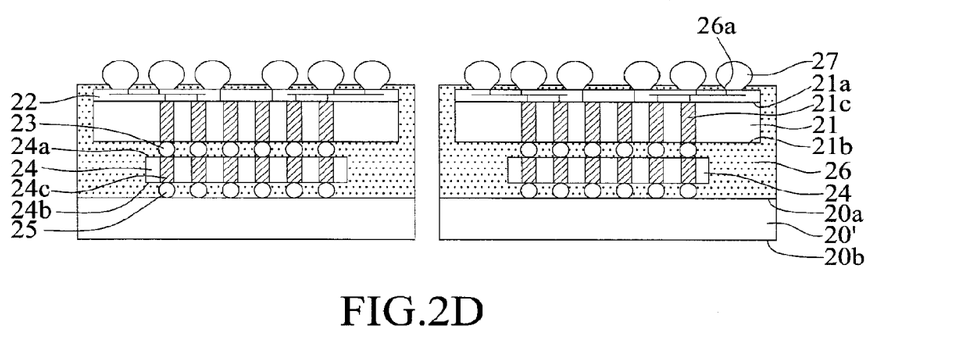

Referring to FIG. 2D, continued from FIG. 2C, a singulation process is performed to form a plurality of semiconductor packages. Since the semiconductor chips 20' are exposed from the encapsulant 27, heat generated in the semiconductor packages during a high temperature process can be effectively dissipated out, thereby preventing warpage in the semiconductor packages and consequently improving the quality of electrical connections among the RDL structures 21, the connection units 24 and the semiconductor chips 20'.

Figure 2E:
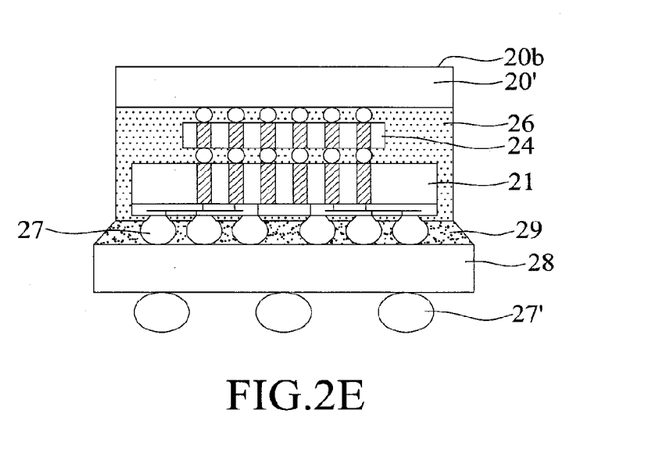

Referring to FIG. 2E, continued from FIG. 2D, such a semiconductor package is formed on a top surface of a package substrate 28 such as a printed circuit board through the conductive bumps 27, and an underfill 29 is filled between the redistribution layer 22 and the package substrate 28. Further, a plurality of solder balls 27' are formed on a bottom surface of the package substrate 28 for external electrical connections.

Second Embodiment

FIGS. 3A to 3E are schematic cross-sectional views illustrating a semiconductor package and a fabrication thereof according to a second embodiment of the present invention.

Figure 3A:
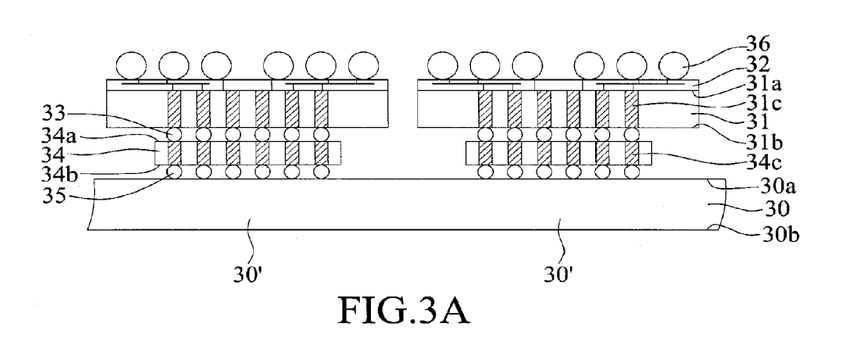
FIGS. 3A to 3E are schematic cross-sectional views illustrating a semiconductor package and a fabrication method thereof according to the second embodiment of the present invention, wherein FIG. 3B' shows another embodiment of FIG. 3B, and FIGS. 3D' and 3E' show processes continued from FIG. 3B'.

Referring to FIG. 3A, a semiconductor wafer 30 has a plurality of semiconductor chips 30'. Each semiconductor chip 30' has a first surface 30a and a second surface 30b opposite the first surface 30a. An RDL structure 31 is formed on the first surface 30a of the semiconductor chip 30'. The RDL structure 31 has a third surface 31a, a fourth surface 31b opposite the third surface 31a and a plurality of first conductive through holes 31c penetrating the third surface 31a and the fourth surface 31b. The RDL structure 31 further has a redistribution layer 32 formed on the third surface 31a, and the RDL structure 31 is formed on the first surface 30a of the semiconductor wafer 30 through the fourth surface 31b.

In the present embodiment, a connection unit 34 is further formed between the fourth surface 31b of the RDL structure 31 and the first surface 30a of the semiconductor wafer 30. The connection unit 34 has a fifth surface 34a and a sixth surface 34b opposite to the fifth surface 34a, and a plurality of second conductive through holes 34c penetrating the fifth surface 34a and the sixth surface 34b. A plurality of first conductive elements 33 are formed between the fourth surface 31b of the RDL structure 31 and the fifth surface 34a of the connection unit 34 and corresponding in position to the first conductive through holes 31c and the second conductive through holes 34c for electrically connecting the RDL structure 31 and the connection unit 34. Further, a plurality of second conductive elements 35 are formed between the sixth surface 34b of the connection unit 34 and the first surface 30a of the semiconductor wafer 30 and corresponding in position to the second conductive through holes 34c for electrically connecting the connection unit 34 and the semiconductor chip 30'. A plurality of conductive bumps 36 are further formed on the redistribution layer 32. The first conductive elements 33 and the second conductive elements 35 can be conductive posts, conductive balls or conductive bumps. The connection unit 34 can have a passive component chip or an active component chip such as a memory chip, an RF chip, a logic chip or an analog chip.

Figure 3B:
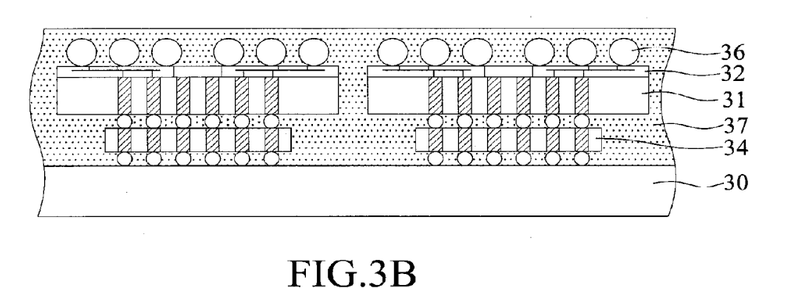

Referring to FIG. 3B, continued from FIG. 3A, an encapsulant 37 is formed on the first surface 30a of the semiconductor wafer 30 for encapsulating the connection units 34, the RDL structures 31, the redistribution layer 32, and the conductive bumps 36.

Alternatively, referring to FIG. 3B', an encapsulant 37 is formed on the first surface 30a of the semiconductor wafer 30 for encapsulating the connection units 34, the RDL structures 31, the redistribution layer 32, and portions of the conductive bumps 36. As such, the conductive bumps 36 are partially exposed from the encapsulant 37.

Figure 3C:
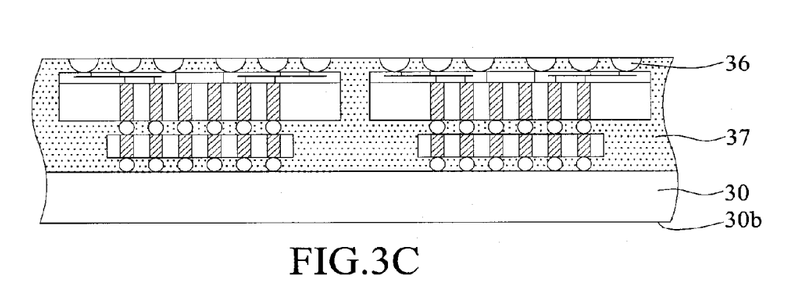

Referring to FIG. 3C, continued from FIG. 3B, portions of the encapsulant 37 and the conductive bumps 36 are removed by grinding so as for the conductive bumps 36 to be flush with a surface of the encapsulant 37.

Figure 3D:
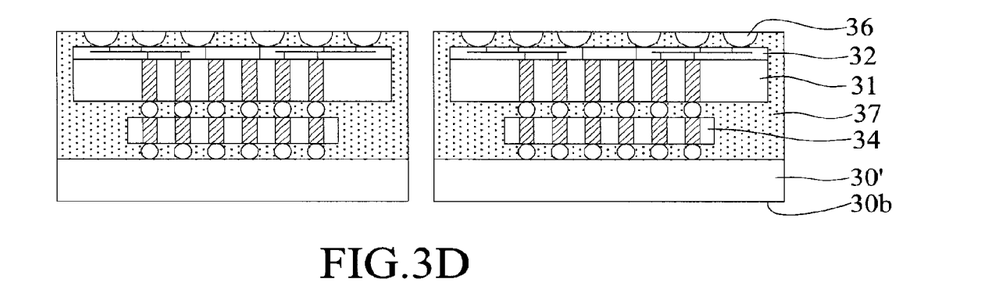

Referring to FIG. 3D, continued from FIG. 3C, a singulation process is performed to form a plurality of semiconductor packages. The semiconductor chips 30' are exposed from the semiconductor packages for facilitating heat dissipation.

Alternatively, referring to FIG. 3D', continued from FIG. 3B', a singulation process is performed.

Figure 3E:
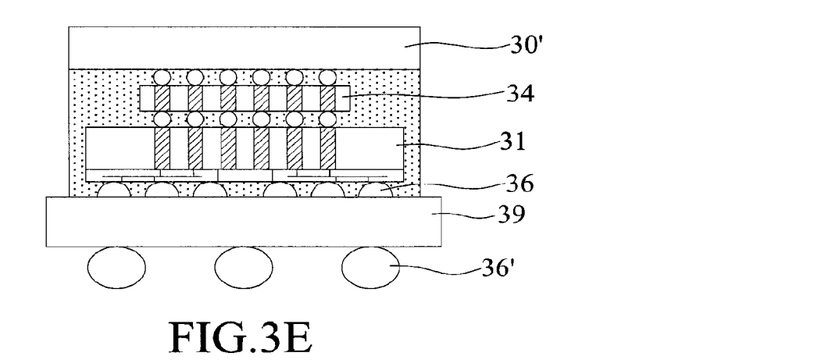

Referring to FIG. 3E, continued from FIG. 3D, such a semiconductor package is disposed on a top surface of a package substrate 39, which may be a printed circuit board, through the conductive bumps 36, and a plurality of solder balls 36' are formed on a bottom surface of the package substrate 39 for external electrical connections.

Alternatively, referring to FIG. 3E', continued from FIG. 3D', such a semiconductor package is disposed on a top surface of a package substrate 39 through the conductive bumps 36, and a plurality of solder balls 36' are formed on a bottom surface of the package substrate 39 for external electrical connection.

Third Embodiment

Figure 4:
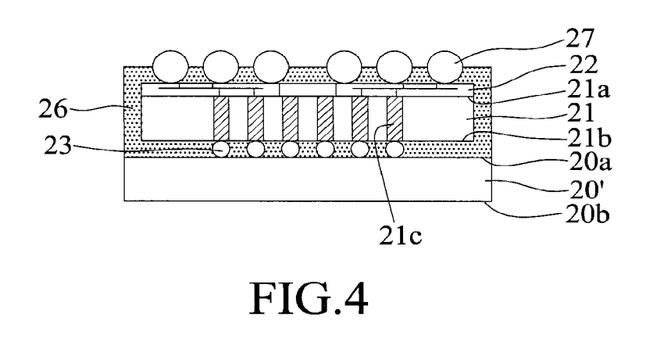
FIG. 4 is a schematic cross-sectional view illustrating a semiconductor package according to the third embodiment of the present invention.

FIG. 4 is a schematic cross-sectional view illustrating a semiconductor package according to the third embodiment of the present invention. The present embodiment differs from the first embodiment in that the present embodiment dispenses with the connection units 24. A plurality of first conductive elements 23 are formed between the fourth surface 21b of the RDL structure 21 and the first surface 20a of the corresponding semiconductor chip 20' for electrically connecting the RDL structure 21 and the semiconductor chip 20'.

Fourth Embodiment

Figure 5:
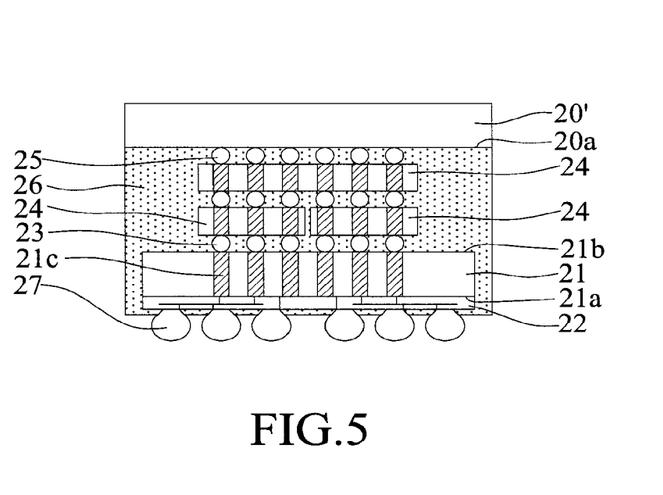
FIG. 5 is a schematic cross-sectional view illustrating a semiconductor package according to the fourth embodiment of the present invention.

FIG. 5 is a schematic cross-sectional view illustrating a semiconductor package according to the fourth embodiment of the present invention. The present embodiment differs from the first embodiment in that the a plurality of connection units 24 are stacked between the fourth surface 21b of the RDL structure 21 and the first surface 20a of the corresponding semiconductor chip 20'.

The present invention further provides a semiconductor package. The semiconductor package includes a semiconductor chip 20'; an RDL structure 21 formed on the semiconductor chip 20' and having a redistribution layer 22; a plurality of conductive bumps 27 formed on the redistribution layer 22; and an encapsulant 26 formed on the semiconductor chip 20' for encapsulating the RDL structure 21.

The semiconductor chip 20' has a first surface 20a and a second surface 20b opposite the first surface 20a.

The RDL structure 21 has a third surface 21a and a fourth surface 21b opposite to the third surface 21a and a plurality of first conductive through holes 21c penetrating the third surface 21a and the fourth surface 21b. The RDL structure 21 is formed on the first surface 20a of the semiconductor chip 20' through the fourth surface 21b and electrically connected to the semiconductor chip 20' through a plurality of first conductive elements 23. The redistribution layer 22 is formed on the third surface 21a of the RDL structure 21.

The encapsulant 26 is formed on the first surface 20a of the semiconductor chip 20' for encapsulating the RDL structure 21 and the redistribution layer 22.

The conductive bumps 27 are embedded in and exposed from the encapsulant 26. In an embodiment, each of the conductive bumps 27 can be partially exposed from the encpasulant 26. In another embodiment, the conductive bumps 27 can be exposed from and flush with a surface of the encapsulant 26. In another embodiment, each of the conductive bumps 27 can be half exposed from and half flush with a surface of the encapsulant 26. The encapsulant 26 can be flush with the semiconductor chip 20' at sides.

Further, one or more connection units 24 can be stacked between the fourth surface 21b of the RDL structure 21 and the first surface 20a of the semiconductor chip 20'. Each of the connection units 24 has a fifth surface 24a and a sixth surface 24b opposite the fifth surface 24a and a plurality of second conductive through holes 24c penetrating the fifth surface 24a and the sixth surface 24b. A plurality of first conductive elements 23 are formed between the fourth surface 21b of the RDL structure 21 and the the connection units 24 for electrically connecting the RDL structure 21 and the connection units 24, and a plurality of second conductive elements 25 are formed between the connection units 24 and the first surface 20a of the semiconductor wafer 20 for electrically connecting the connection units 24 and the semiconductor chip 20'. The connection units 24 are encapsulated by the encapsulant 26.

The RDL structure 21 and the one or stacked connection units 24 can be made of Si, SiC, GaAs, $SiO_2$ such as crystal or glass, or $Al_2O_3$ such as sapphire. The encapsulant 26 can be a made of a polymer material, a resin material, polyimide, silicon oxide, epoxide benzocyclobutenes (BCB), silk TM (Dow Chemical) or a combination thereof.

The semiconductor package can further have a package substrate 28 such as a printed circuit board. The conductive bumps 27 on the redistribution layer 22 are formed on a surface of the package substrate 28, an underfill 29 is filled between the redistribution layer 22 and the surface of the package substrate 28, and a plurality of solder balls 27' are formed on another surface of the package substrate 28 opposite to the redistribution layer 22.

According to the present invention, RDL structures having a redistribution layer formed thereon are formed on a semiconductor wafer and then an encapsulant is formed on the semiconductor wafer to encapsulate the RDL structures and the redistribution layer. Since the second surfaces of semiconductor chips of the semiconductor wafer are exposed from the encapsulant, heat generated in the semiconductor package during a high temperature process can be effectively dissipated out, thereby preventing warpage and poor electrical connection of the semiconductor package. Further, the present invention facilitates to simplify the fabrication process, reduce fabrication cost and improve product yield.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A fabrication method of a semiconductor package, comprising the steps of:
   providing a semiconductor wafer having a plurality of semiconductor chips respectively with a first surface and a second surface opposite to the first surface;
   forming an RDL (redistribution layer) structure on the first surface of the semiconductor wafer corresponding to the semiconductor chips, wherein the RDL structure has opposite third and fourth surfaces and a plurality of first conductive holes penetrating the third and fourth surfaces thereof, has a redistribution layer formed on the third surface thereof, and has a plurality of conductive bumps formed on the redistribution layer, and the RDL structure is electrically connected to the first surface of the semiconductor chip through a plurality of first conductive elements;
   connecting the RDL structure to the first surface of semiconductor wafer through a plurality of first conductive elements;
   forming an encapsulant on the first surface of the semiconductor wafer for encapsulating the RDL structure; and
   forming a plurality of conductive bumps on the redistribution layer in a manner that the plurality of conductive bumps are embedded in and exposed from the encapsulant.

2. The method of claim 1, wherein forming the conductive bumps comprises the steps of:
   forming the plurality of conductive bumps on the redistribution layer; and
   forming the encapsulant on the first surface of the semiconductor chip for encapsulating the RDL structure and exposing the conductive bumps.

3. The method of claim 1, wherein forming the conductive bumps comprises the steps of:
   forming the plurality of conductive bumps on the redistribution layer;
   forming the encapsulant on the first surface of the semiconductor chip for encapsulating the RDL structures and the conductive bumps; and
   removing portions of the encapsulant and the conductive bumps by grinding such that the conductive bumps are flush with a surface of the encapsulant.

4. The method of claim 1, wherein forming the conductive bumps comprises the steps of:
   forming the encapsulant on the first surface of the semiconductor chip for encapsulating the RDL structures;
   forming a plurality of openings in the encapsulant for exposing portions of the redistribution layer; and
   forming the plurality of conductive bumps in the openings of the encapsulant, respectively.

5. The method of claim 4, wherein the openings of the encapsulant are formed by laser ablation or etching.

6. The method of claim 1, further comprising the step of forming a connection unit or stacked connection units between the fourth surface of the RDL structure and the first surface of the semiconductor chip, wherein the connection unit or each of the stacked connection units has a plurality of second conductive through holes penetrating therethrough, the connection unit or stacked connection units are electrically connected to the RDL structure through the first conductive elements and electrically connected to the corresponding semiconductor chip through the second conductive elements, and the connection unit or stacked connection units are encapsulated by the encapsulant.

7. The method of claim 1, further comprising the step of performing a singulation process.

8. The method of claim 7, after performing the singulation process, further comprising the step of forming the redistribution layer on a package substrate through the conductive bumps and filling an underfill between the redistribution layer and the package substrate.

9. The method of claim 6, wherein the RDL structure and the connection unit or stacked connection units are made of Si, SiC, GaAs, $SiO_2$ or $Al_2O_3$.

* * * * *